United States Patent
Padaparambil

(10) Patent No.: US 7,864,084 B2
(45) Date of Patent: Jan. 4, 2011

(54) SERIALIZER ARCHITECTURE FOR SERIAL COMMUNICATIONS

(75) Inventor: Muralikumar A. Padaparambil, Poughkeepsie, NY (US)

(73) Assignee: Seiko Epson Corporation, Tokyo (JP)

( * ) Notice: Subject to any disclaimer, the term of this patent is extended or adjusted under 35 U.S.C. 154(b) by 352 days.

(21) Appl. No.: 12/102,712

(22) Filed: Apr. 14, 2008

(65) Prior Publication Data

US 2009/0259781 A1    Oct. 15, 2009

(51) Int. Cl.
    *H03M 9/00* (2006.01)
(52) U.S. Cl. ............................. 341/101; 341/100
(58) Field of Classification Search ............. 341/100, 341/101
    See application file for complete search history.

(56) References Cited

U.S. PATENT DOCUMENTS

| | | | |
|---|---|---|---|
| 5,357,249 A * | 10/1994 | Azaren et al. | 341/100 |
| 6,107,946 A * | 8/2000 | Jeong | 341/101 |
| 6,417,790 B1 | 7/2002 | Fiedler et al. | |
| 6,593,863 B2 | 7/2003 | Pitio | |
| 6,614,371 B2 * | 9/2003 | Zhang | 341/101 |
| 6,628,679 B1 | 9/2003 | Talarek | |
| 6,937,173 B2 | 8/2005 | Kim | |
| 6,977,981 B2 | 12/2005 | Measor | |
| 7,006,021 B1 | 2/2006 | Lombaard | |
| 7,079,055 B2 | 7/2006 | Padaparambil | |
| 2002/0141524 A1 | 10/2002 | Boerstler | |

* cited by examiner

*Primary Examiner*—Jean B Jeanglaude

(57) ABSTRACT

A serializer includes a first stage configured to convert m-bit-wide parallel data into n-bit-wide parallel data, where n is $2^x$, $m \geq 2^{x+y}$, x is an integer of at least 1, and y is an integer of at least 1, where the first stage includes a memory unit configured to store the m-bit-wide parallel in response to a timing signal and a first multiplexer configured to output the n-bit-wide parallel data in response to a frequency-multiplied derivative of the timing signal, and a current mode logic (CML) multiplexer stage configured to convert the n-bit-wide parallel data into serial data on successive transitions of n phase-shifted versions of the frequency-multiplied derivative of the timing signal.

8 Claims, 8 Drawing Sheets

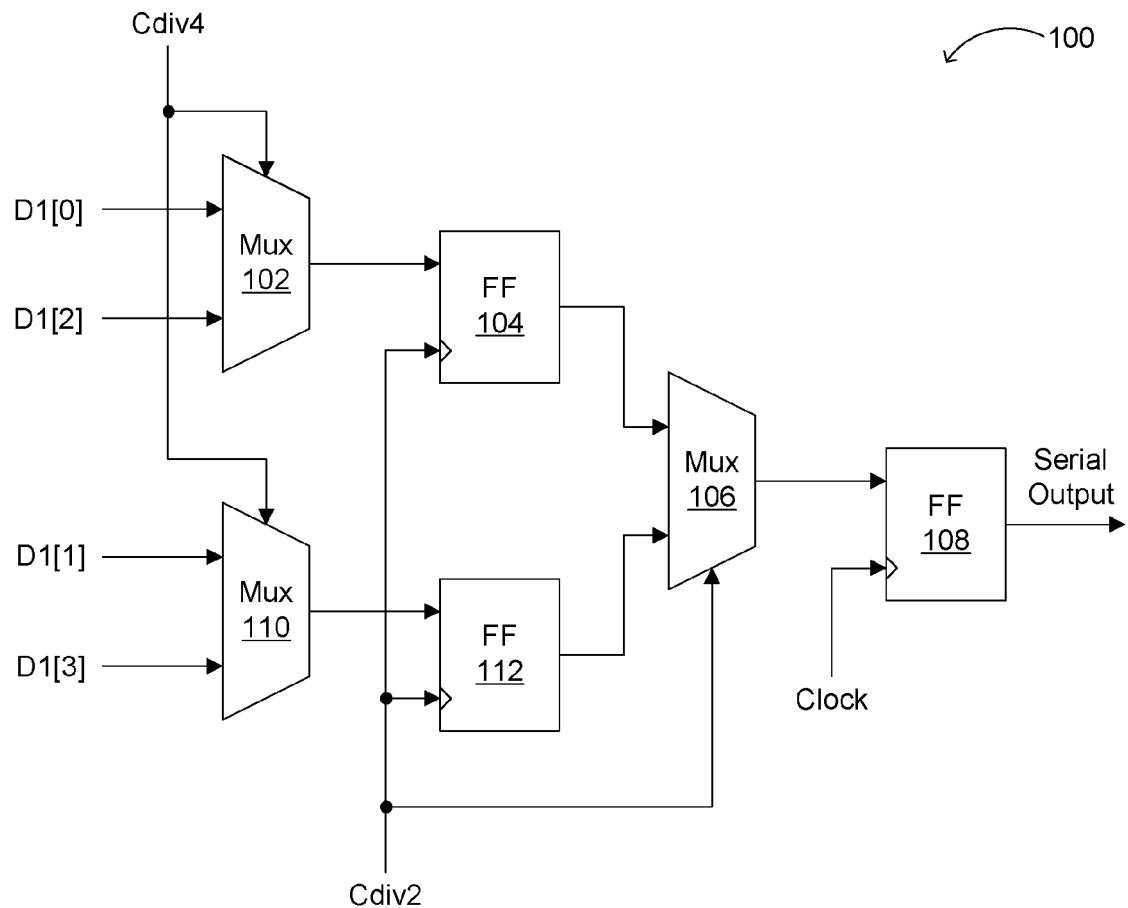
FIG. 1A (conventional)
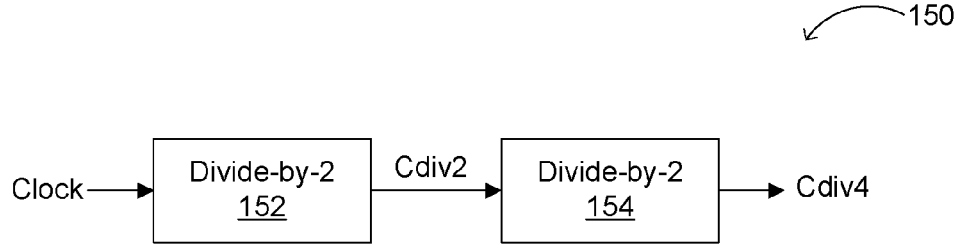
FIG. 1B (conventional)

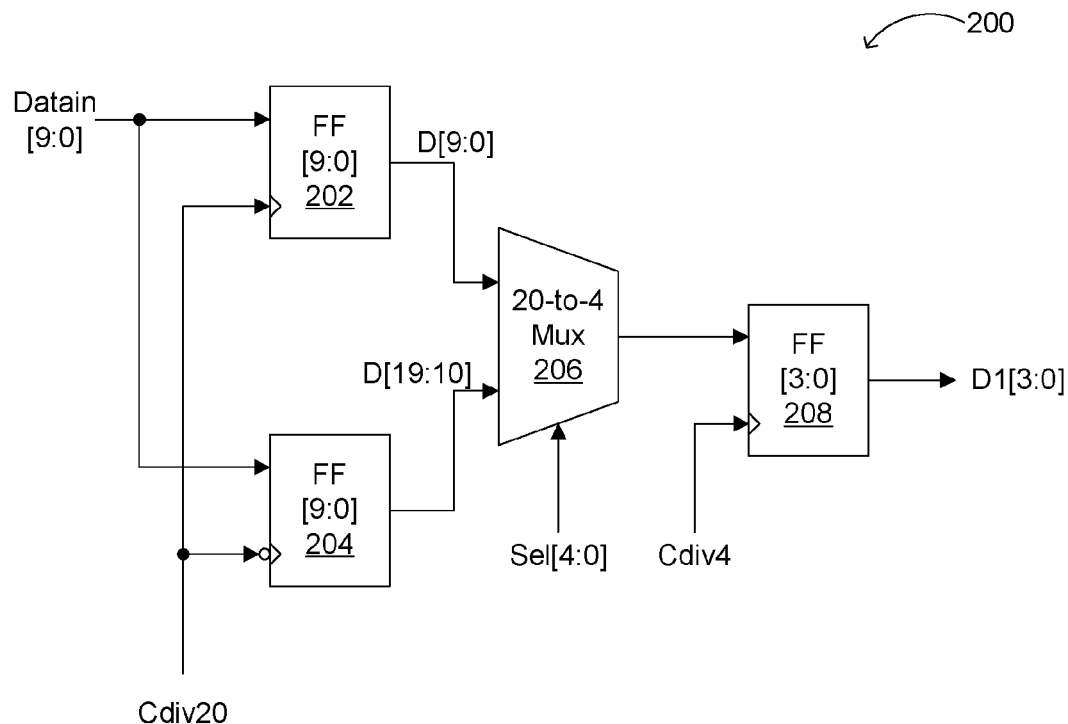
FIG. 2A (conventional)
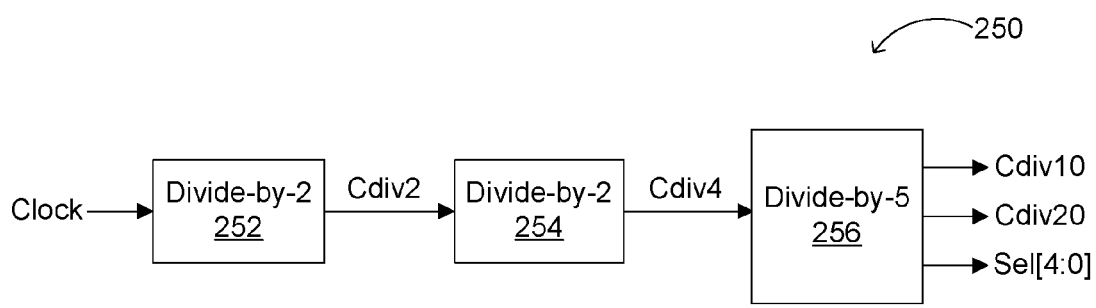
FIG. 2B (conventional)

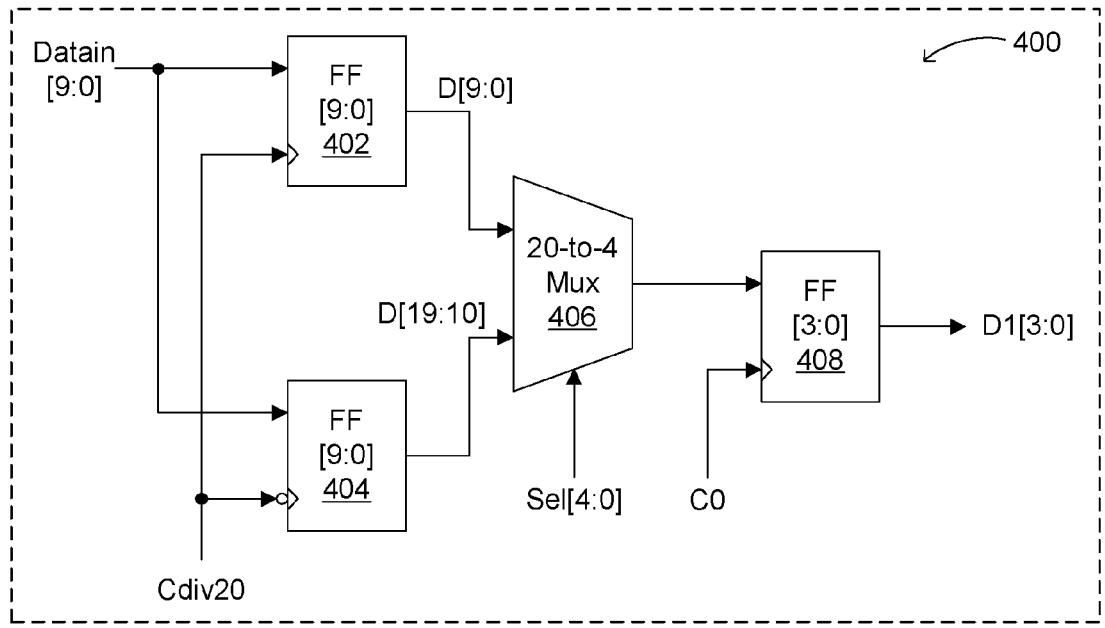
FIG. 4A
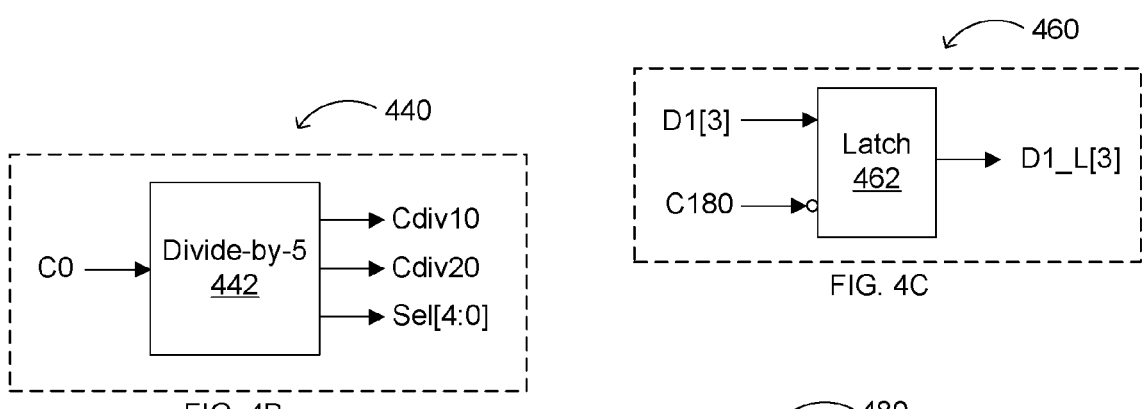
FIG. 4B
FIG. 4C
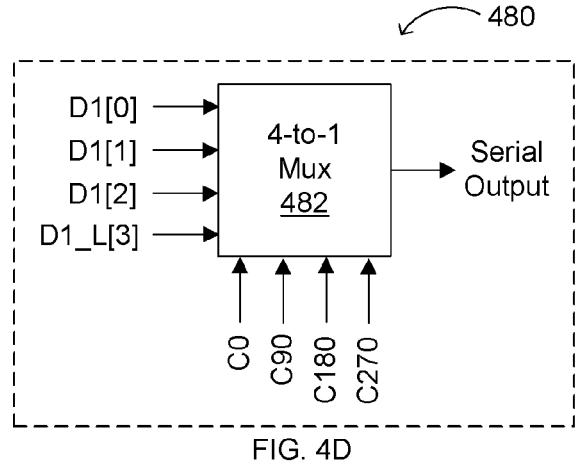
FIG. 4D

SERIALIZER ARCHITECTURE FOR SERIAL COMMUNICATIONS

FIELD OF THE INVENTION

The present invention generally relates to the field of serial communication. More specifically, embodiments of the present invention pertain to methods, circuits, architectures, and/or systems for converting parallel data into serial data.

DISCUSSION OF THE BACKGROUND

Serializers or parallel-to-serial converters are widely used in serial communication in order to convert parallel data streams into serial data streams. A serializer is an important component for transmissions in such a communication network, and generally converts a low-speed parallel data signal into a high-speed serial data signal. Thus, in serial communication systems (e.g., 8b/10b), encoded parallel data is serialized into serial data streams, and transmitted. Typically, in such an exemplary system, the encoded data is a 10-bit parallel data word, and hence a tree-based serializer architecture cannot be employed.

FIG. 1A shows a conventional tree-based serializer architecture 100, and FIG. 1B shows a conventional clock division approach 150. In this approach, only last flip-flop (FF) 108 operates at the clock frequency (e.g., the serial output data rate), and the preceding stage (e.g., FFs 104 and 112, with inputs to multiplexer (mux) 106) operates at half the clock frequency (e.g., Cdiv2). The initial stage, including multiplexers 102 and 110, operates at one fourth the clock frequency (e.g., Cdiv4). As shown in FIG. 1B, Cdiv2 can be provided by divide-by-2 divider circuit 152, and Cdiv4 can be provided by divide-by-2 circuit 154. Such a tree-based architecture has the drawback of only being adaptable to receive parallel data of $2^x$ bits, where $x \geq 1$. Thus, serializers used in serial communication that receive 10-bit parallel data words cannot use such a tree-based scheme directly.

FIG. 2A shows a conventional low-speed serializer portion 200, and FIG. 2B shows a clock divider portion 250, in a hybrid serializer architecture approach. The final 4-to-1 serializer stage (e.g., serializing bits D1[3:0]) may be implemented using a tree-based architecture (as shown in FIG. 1). Because a tree-based architecture can only be used with $2^x$ parallel data bits, for a particular application (e.g., 10-bit parallel data), the serializer may be broken into two sections. One such section may be the low-speed section (e.g., 200), and the other section may be the high-speed section (e.g., tree-based). In such an approach, the low-speed section is typically implemented using relatively simple full-swing logic, whereas the high-speed section may utilize other high-speed circuitry (e.g., differential logic), and a design trade-off can be made based on power and performance.

In FIG. 2A, 10-bit parallel data (e.g., Datain[9:0]) is loaded into a 20-bit register formed by flip-flops FF[9:0] 202 in parallel with flip-flops FF[9:0] 204. Data registered at flip-flops FF[3:0] 208 in 4-bit blocks is selected from the 20-bit register through a 20-to-4 multiplexer 206 and then fed into a 4-to-1 tree-based serializer, as discussed above. Also, 20-to-4 multiplexer 206 uses signal Sel[4:0] for selecting 4-bit blocks of data from the 20-bit register. In FIG. 2B, divide-by-2 divider 252 can be used to create clock Cdiv2 (e.g., for the tree-based section) from the input clock. Divide-by-2 divider 254 can be used to create clock Cdiv4 (e.g., for FF[3:0] 208) from Cdiv2. And, divide-by-5 divider 256 can provide clocks Cdiv10, Cdiv20 (e.g., for clocking parallel flip-flops 202 and 204), and signals Sel[4:0]). FIG. 3 shows associated timing waveforms for operation of the hybrid serializer of FIGS. 2A-2B.

Serializer circuits operate at the data transmission rate or "data rate," and thus can consume a significant amount of power in a serial communication network. In addition, as the data rates of serial communication networks become higher (e.g., into the multi-gigahertz range), it may not be possible for conventional serializer architectures to provide sufficient serialization quality at low power.

SUMMARY OF THE INVENTION

Embodiments of the present invention relate to methods, algorithms, circuits, and/or systems for serializing data.

In one embodiment, a serializer can include a first stage configured to convert m-bit-wide parallel data into n-bit-wide parallel data, where n is an integer of at least 2 and m is an integer greater than n, where the first stage includes a memory unit configured to store the m-bit-wide parallel data in response to a timing signal, and a first multiplexer configured to output the n-bit-wide parallel data in response to a frequency-multiplied derivative of the timing signal, and a current mode logic (CML) multiplexer stage configured to convert the n-bit-wide parallel data into differential serial data on successive transitions of n phase-shifted versions of the frequency-multiplied derivative of the timing signal. In various implementations, n is $2^x$, where x is an integer of at least 1, and/or $m \neq 2^{x+y}$, where y is a positive integer.

In another embodiment, a CML multiplexer for serializing an n-bit-wide parallel data word can include a load circuit coupled between a first supply node and differential serial data nodes, n differential selectors, each having first and second transistors controllable by a complementary bit pair of the n-bit-wide parallel data word, and coupled between a first node and differential serial data nodes and a discharge path controllable by timing signals overlapping for a phase angle of 360°/n, and a bias circuit coupled to the load circuit, the discharge path, and a second supply node, the bias circuit being configured to provide a fixed current through the n differential selectors.

In another embodiment, a method of serializing data can include registering an m-bit-wide parallel data word in a first stage using a timing signal, converting the m-bit-wide parallel data word into an n-bit-wide parallel data word, where the n-bit-wide parallel data word is updated on a frequency-multiplied derivative of the timing signal, and enabling a discharge path from a serial data node during overlapping phase-shifted, frequency-multiplied derivatives of the timing.

Embodiments of the present invention can advantageously provide a high-speed serializer approach that utilizes a relatively low-speed first stage coupled to a high-speed (e.g., CML) multiplexer second stage. Further, by using quarter-rate clocking, embodiments of the present invention can result in reduced power consumption and design complexity, as compared to conventional full data-rate clocking serializer architectures. These and other advantages of the present invention will become readily apparent from the detailed description of preferred embodiments below.

BRIEF DESCRIPTION OF THE DRAWINGS

FIGS. 1A-1B illustrate a conventional tree-based serializer architecture approach.

FIGS. 2A-2B illustrate a conventional hybrid serializer architecture approach.

FIGS. 4A-4D illustrate an exemplary quarter-rate serializer in accordance with embodiments of the present invention.

DETAILED DESCRIPTION OF THE PREFERRED EMBODIMENTS

Figure 3:
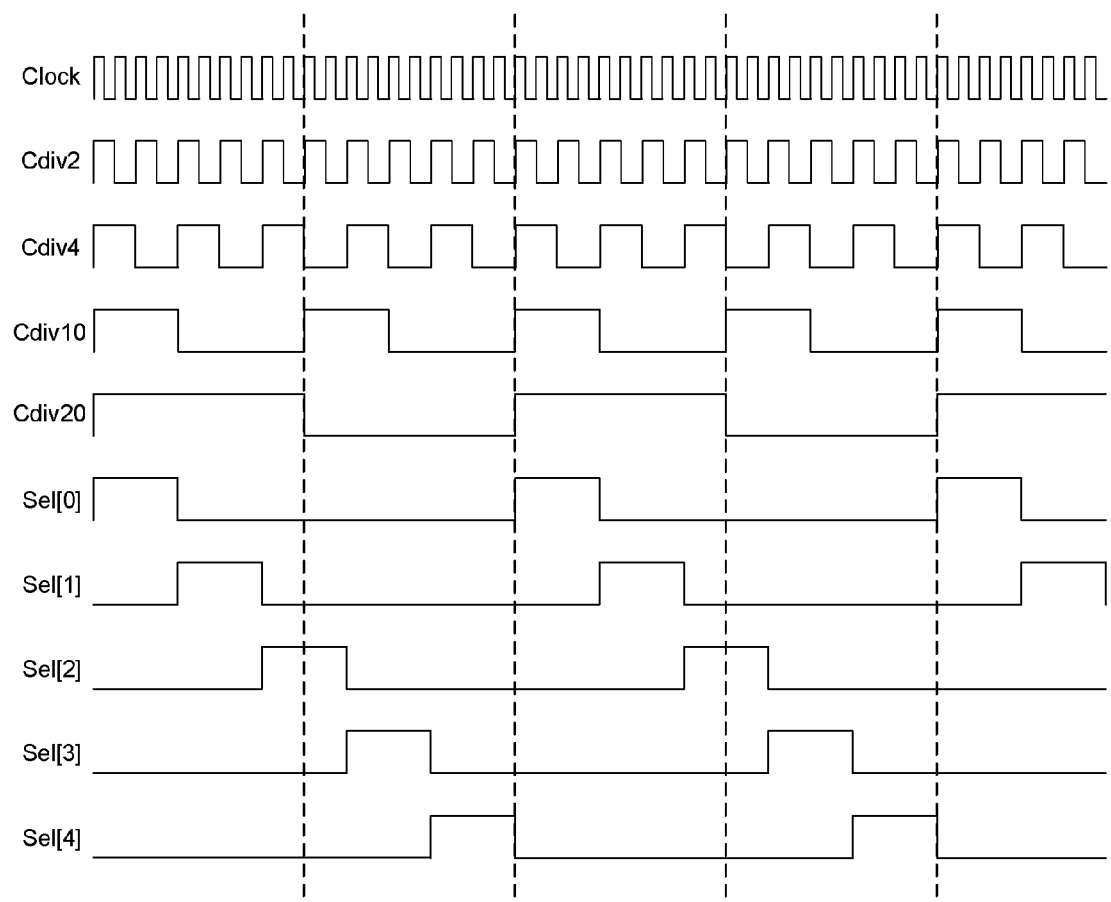
FIG. 3 illustrates timing waveforms for operation of the hybrid serializer of FIGS. 2A-2B.

Reference will now be made in detail to the preferred embodiments of the invention, examples of which are illustrated in the accompanying drawings. While the invention will be described in conjunction with the preferred embodiments, it will be understood that they are not intended to limit the invention to these embodiments. On the contrary, the invention is intended to cover alternatives, modifications and equivalents that may be included within the spirit and scope of the invention as defined by the appended claims. Furthermore, in the following detailed description of the present invention, numerous specific details are set forth in order to provide a thorough understanding of the present invention. However, it will be readily apparent to one skilled in the art that the present invention may be practiced without these specific details. In other instances, well-known methods, procedures, components, and circuits have not been described in detail so as not to unnecessarily obscure aspects of the present invention.

Some portions of the detailed descriptions which follow are presented in terms of processes, procedures, logic blocks, functional blocks, processing, and other symbolic representations of operations on code, data bits, data streams or waveforms within a computer, processor, controller and/or memory. These descriptions and representations are generally used by those skilled in the data processing arts to effectively convey the substance of their work to others skilled in the art. A process, procedure, logic block, function, process, etc., is herein, and is generally, considered to be a self-consistent sequence of steps or instructions leading to a desired and/or expected result. The steps generally include physical manipulations of physical quantities. Usually, though not necessarily, these quantities take the form of electrical, magnetic, optical, or quantum signals capable of being stored, transferred, combined, compared, and otherwise manipulated in a computer or data processing system. It has proven convenient at times, principally for reasons of common usage, to refer to these signals as bits, waves, waveforms, streams, values, elements, symbols, characters, terms, numbers, or the like, and to their representations in computer programs or software as code (which may be object code, source code or binary code).

It should be borne in mind, however, that all of these and similar terms are associated with the appropriate physical quantities and/or signals, and are merely convenient labels applied to these quantities and/or signals. Unless specifically stated otherwise and/or as is apparent from the following discussions, it is appreciated that throughout the present application, discussions utilizing terms such as "processing," "operating," "computing," "calculating," "determining," "manipulating," "transforming" or the like, refer to the action and processes of a computer or data processing system, or similar processing device (e.g., an electrical, optical, or quantum computing or processing device or circuit), that manipulates and transforms data represented as physical (e.g., electronic) quantities. The terms refer to actions and processes of the processing devices that manipulate or transform physical quantities within the component(s) of a circuit, system or architecture (e.g., registers, memories, other such information storage, transmission or display devices, etc.) into other data similarly represented as physical quantities within other components of the same or a different system or architecture.

Furthermore, in the context of this application, the terms "wire," "wiring," "line," "signal," "conductor" and "bus" refer to any known structure, construction, arrangement, technique, method and/or process for physically transferring a signal from one point in a circuit to another. Also, unless indicated otherwise from the context of its use herein, the terms "known," "fixed," "given," "certain" and "predetermined" generally refer to a value, quantity, parameter, constraint, condition, state, process, procedure, method, practice, or combination thereof that is, in theory, variable, but is typically set in advance and not varied thereafter when in use.

Similarly, for convenience and simplicity, the terms "clock," "time," "timing," "rate," "period" and "frequency" are, in general, interchangeable and may be used interchangeably herein, but are generally given their art-recognized meanings. Also, for convenience and simplicity, the terms "data," "data stream," "waveform" and "information" may be used interchangeably, as may (a) the terms "flip-flop," "latch" and "register," and (b) the terms "connected to," "coupled with," "coupled to," and "in communication with," (which may refer to direct or indirect connections, couplings, or communications) but these terms are generally given their art-recognized meanings herein.

The invention relates to hardware implementations of the present structure, as well as methods of serializing a parallel data signal and circuits implementing the same. Embodiments of the present invention can advantageously provide a high-speed serializer approach that utilizes a relatively low-speed first stage coupled to a current mode logic (CML) high-speed multiplexer second stage. Further, by using a fractional rate-clocking scheme (e.g., quarter-rate clocking), embodiments of the present invention can result in reduced power consumption and design complexity, as compared to conventional full data-rate clocking serializer architectures. The invention, in its various aspects, will be explained in greater detail below with regard to exemplary embodiments.

According to various embodiments of the present invention, a circuit for serializing can include standard logic components in a relatively low-speed first stage: a multiplexer, flip-flops, latches, and frequency dividers. In a relatively high-speed second stage, CML logic for producing a differential serial data output can be employed. Of course, other types of circuits and/or digital logic blocks can also be utilized in specific embodiments. A target application for the particular example circuitry shown herein involves serializing 8b/10b encoded parallel data at high-speed rates (e.g., greater than about 3 GHz). In one implementation, the first stage converts 10-bit-wide parallel data into 4-bit-wide parallel data, while the second stage converts from the 4-bit-wide parallel data into differential serial data.

An Exemplary Serializer

An exemplary serializer includes: (i) a first stage configured to convert m-bit-wide parallel data into n-bit-wide parallel data, where n is an integer $\geq 2$ and m is an integer $>n$, the first stage including a memory unit configured to store the m-bit-wide parallel data in response to a timing signal, and a first multiplexer configured to output the n-bit-wide parallel data in response to a frequency-multiplied derivative of the timing signal; and (ii) a CML multiplexer stage configured to convert the n-bit-wide parallel data into differential serial data on successive transitions of n phase-shifted versions of the frequency-multiplied derivative of the timing signal. For example, in the first stage of the present serializer, n may be $2^x$, where x is an integer of at least 1. Additionally or alternatively, $m \neq 2^{x+y}$, where y is an integer of at least 1.

FIG. 4A shows an exemplary low-speed portion 400, FIG. 4B shows an exemplary (clock) divider portion 440, FIG. 4C shows an exemplary latch portion 460, and FIG. 4D shows an exemplary high-speed multiplexer portion 480, of an exemplary quarter-rate serializer in accordance with embodiments of the present invention. Here, multi-phase clocking is used to quickly serialize $2^x$ parallel data words, where $2^x$ clock phases with phase differences of $2\pi/2^x$ radians can be used in the multi-phase clocking. For example, serializing a 4-bit data word utilizes four clocks with a phase difference of $\pi/2$ (90°). Of course, this approach can be extended to any $2^x$ parallel data serialization (e.g., where x is an integer of at least 1; for example, an 8-bit-wide parallel data word can be serialized using 8 clock phases with a phase difference of $\pi/4$, or 45°).

The exemplary serializer of FIGS. 4A-4D may be referred to as a quarter-rate serializer because the clocking is performed with a clock having a frequency of ¼ of the data-rate frequency. Low-speed portion 400 may be the same as or similar to other tree-based structures, such as those discussed above with regard to FIGS. 2A-2B. Thus, FF[9:0] 402 and FF[9:0] 404 can latch data using clock Cdiv20. Preferably, the first set of flip-flops 402 latches the data on a first edge, transition or logic level of the divided clock Cdiv20, and a second set of flip-flops 404 latches the data on a second edge, transition or logic level of the divided clock Cdiv20 complementary to the first edge, transition or logic level. A digital and/or low-speed multiplexer (e.g., 20-to-4 multiplexer 406) can then, based on selection signal Sel[4:0], output 4-bit parallel words from FF[9:0] 402 and FF[9:0] 404 to FF[3:0] 408 to be latched and/or output using clock C0 to provide parallel data word D1[3:0]. Timing signals (e.g., clock signals Cdiv10, Cdiv20) and the multiplexer select signal Sel[4:0] may be similar to those discussed above with reference to FIG. 3. In the embodiment of FIGS. 4A-4D, relative to the conventional 20:4 multiplexer 200 in FIG. 2A, clock C0 may replace the quarter-rate clock.

Referring to FIG. 4B, a clock divider (e.g., divide-by-5 circuit 442) may receive quarter-rate clock C0, and provide divided clocks Cdiv10 and Cdiv20 (e.g., one-tenth and/or one-twentieth rate clocks for latching data in FFs 402 and 404), and one or more mux selection signals (e.g., Sel[4:0]).

Certain embodiments of the high-speed portion (e.g., latch 460 and/or mux 480 of FIGS. 4C-4D) can utilize a multi-phase clock signal (e.g., C0, C90, C180, and C270, having phase differences of 0°, 90°, 180°, and 270°, respectively, with respect to clock C0) to control high-speed 4-to-1 multiplexer 482, thereby enabling a function identical to the 4-to-1 serializer of FIG. 1A. Alternatively, one may employ an eight-phase clock signal (e.g., having phase differences of 00, 45°, 90°, 135°, 180°, 225°, 270°, and 315°, respectively, with respect to clock C0), but a slower timing signal (e.g., Cdiv40) should be employed to latch data in the flip-flops (which would include a 40-bit latch to create 40-bit-wide, parallel latched data) to match the data throughput through the digital m-bit to n-bit multiplexer 400 (FIG. 4A), which would comprise a 40-to-8 multiplexer that produces 8 bit parallel data, and the high-speed serializer section (FIG. 4D) would be an 8-to-1 multiplexer. Further alternatives for serializing 10-bit-wide parallel data include a first-stage comprising a 10-bit-wide latch, clocked by a ½-rate clock (e.g., Cdiv2) and output to a 2-to-1 second stage CML multiplexer that operates using a half-rate (or 2-phase) clock, having phase differences of 0° and 180°; a 10-bit-wide first-stage latch, clocked by a ⅕-rate clock (e.g., Cdiv5) and output to a 5-to-1 second stage CML multiplexer that operates using a ⅕-rate (or 5-phase) clock, having phase differences of 0°, 72°, 144°, 216°, and 288°; etc. One skilled in the art can easily envision a nearly limitless number of m-to-n first stages, operating in accordance with a 1/n-rate clock, and n-bit CML second stage serializers, operating in accordance with an n-phase clock (where the difference between adjacent phases is 360°/n).

Also, latch 462 (FIG. 4C) can provide a latched most significant bit (MSB) (e.g., D1_L[3]) from a first or last bit (e.g., D1[3]) of the n-bit-wide parallel data word. Naturally, one may latch the least significant bit and/or a different bit of the n-bit-wide parallel data word instead, depending on design and/or application choices. One may additionally or alternatively input to multiplexer 482 complement clocks XC0, XC90, XC180, and XC270, corresponding to clocks C0, C90, C180, and C270, respectively, to add additional clock phases and/or complementary selection signals to the high-speed multiplexer. In each case, a phase difference of 90° is maintained between adjacent clocks in this particular example. Further, while a 10-bit serializer approach is shown in the example of FIGS. 4A-4D, any suitable m-bit serialization (e.g., 40-bit) can be supported in certain embodiments.

An Exemplary High-speed Multiplexer

An exemplary high-speed multiplexer for serializing an n-bit-wide parallel data word includes: (i) a load circuit coupled between a first supply node and differential serial data nodes; (ii) n differential selectors, where each differential selector includes (a) first and second transistors controllable by a complementary bit pair of the n-bit-wide parallel data word, and coupled between a first node and differential serial data nodes and (b) a discharge path controllable by clocks overlapping for a phase angle of about 360°/n; and (iii) a bias circuit coupled to the load circuit, the discharge path, and a second supply node, the bias circuit being configured to provide a fixed current through the n differential selectors.

Figure 5:
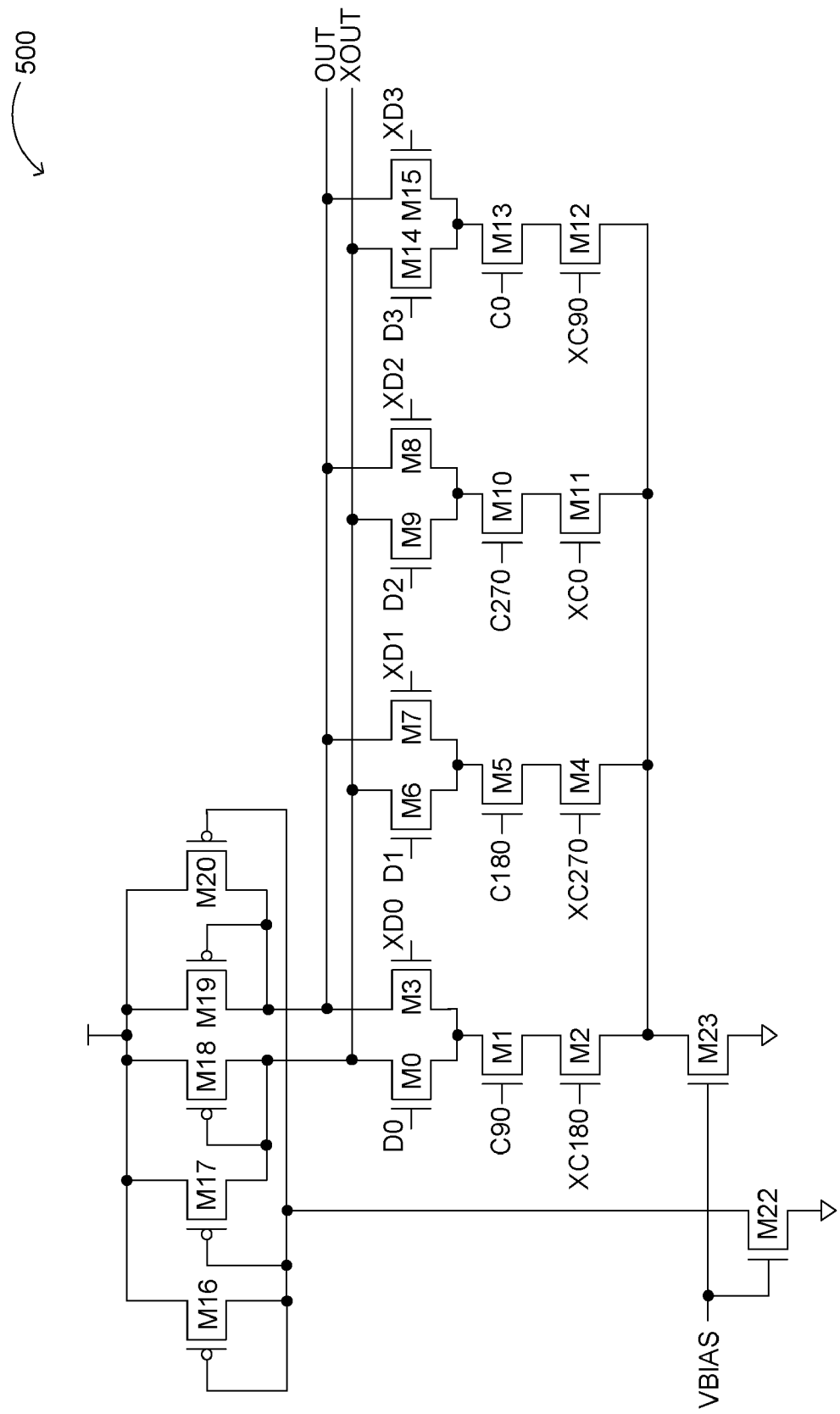
FIG. 5 is a circuit diagram showing an exemplary high-speed multiplexer in accordance with embodiments of the present invention.

FIG. 5 shows an exemplary circuit diagram of an exemplary high-speed multiplexer 500 in accordance with embodiments of the present invention. While a 4-to-1 serializer/multiplexer is shown here, this approach can be expanded to any $2^x$-to-1 serializer (e.g., 2-bit, 8-bit, 16-bit, etc.). Further, while a differential CML circuit is shown in this particular example, any suitable logic form (e.g., other differential approaches, dynamic pre-charge logic, emitter-coupled logic, etc.) can be utilized in certain embodiments.

Here, in exemplary high-speed multiplexer 500, VBIAS provides a control voltage to establish a fixed current in transistors M16 and M22, which is mirrored into transistor M23. Transistors M17 and M20 can provide a current source load, while transistors M18 and M19 also provide a diode load for the multiplexer outputs. Any other suitable type of load for CML operation (e.g., resistors or diode loads) can also be utilized in place of transistors M17-M20. Alternatively, a bias applied to the gates of transistors M16, M17 and M20 that is complementary to VBIAS may be utilized to provide further power savings and/or increased performance.

Figure 6:
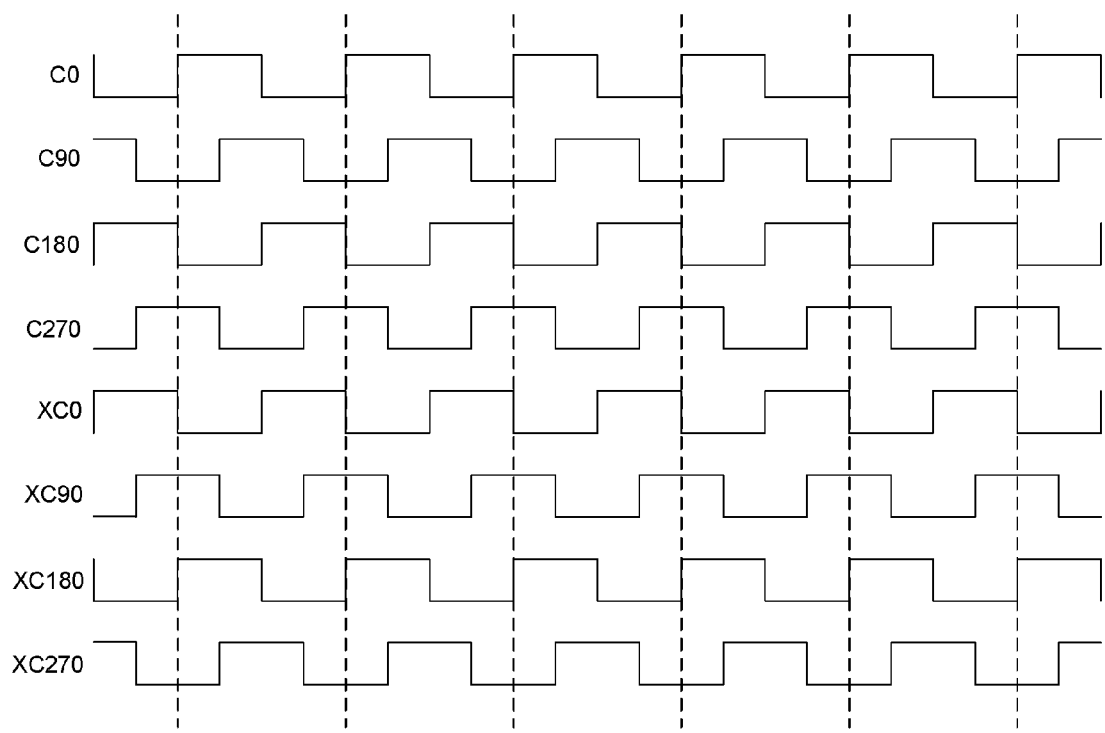
FIG. 6 is an exemplary timing diagram of timing signals used in the high-speed multiplexer of FIG. 5.

FIG. 6 shows an exemplary timing diagram of clock or timing signals used in the high-speed multiplexer of FIG. 5. To send data from a first differential selector comprising NMOS transistors M0-M3, Data bit D0 (shown as differential data D0/XD0) can be sent to the output (OUT) when clock signal C90 transitions high. This is because complementary clock signal XC180 transitions high in advance of clock signal C90 going high, resulting in transistor M2 already being on when clock signal C90 transitions high. One of the transistors M0 and M3 sinks current from the corresponding output line XOUT or OUT, respectively, depending on the state or value of data bit D0. Thus, data bit D0 goes out (as differential data) shortly after clock C90 transitions high. Similarly, other data bits D1-D3 can be sent to output (OUT), with complementary data bits going to XOUT. Thus, when clock signals C90, C180, C270, and C0 go high, corresponding data bits D0, D1, D2, and D3, are sent via OUT/XOUT from a first selector (e.g., comprising transistors M0-M3), a second selector (e.g., comprising transistors M4-M7), a third selector (e.g., comprising transistors M8-M11), and a fourth selector (e.g., comprising transistors M12-M15), respectively. Thus, a particular data bit from the parallel data word can be selected for serialization during the overlap of one of the multi-phase (e.g., 360°/n) timing signals and either the complement of the adjacent +360°/n phase or the true signal of the adjacent −360°/n phase. One skilled in the art can also easily envision single-ended versions of the first through fourth selectors, where the data input to and output from the multiplexer 500 is only the true value/state (e.g., D0 only, without XD0).

Because all bits in the parallel data word D0-D3 received by multiplexer 500 are latched when the respective selectors are enabled, all of the data bits experience the same delay in reaching OUT/XOUT. Data D1[2-0] may be presented to the high speed multiplexer 500 on the rising edge of timing signal C0 (see, e.g., FIG. 4A). However, data bit D3 (or other data bit selected by multiplexer 500 for output on the same transition or level as the timing signal that controls flip-flop 408 in FIG. 4A) may be held in a latch 462 (see FIG. 4C), clocked by timing signal C180, prior to its transmission to high-speed multiplexer 500 as D1_L[3]. In the example of FIG. 5, data bit D3 is output on a rising edge of C0 in the high-speed multiplexer 500, thereby enabling bit D3 to go out when clock signal C0 is high. But n-bit parallel data D1[3:0] is also updated on the rising edge of C0 in FIG. 4A. As a result, in FIG. 4C, D1[3] is latched when clock signal C180 goes low. By latching the data bit D1[3] earlier and presenting the latched data bit D1_L[3] to the multiplexer 500 on a different (and preferably, complementary and/or 180° out-of-phase) timing signal, all of the data paths for each bit of the n-bit parallel data word being serialized may be substantially the same and stable when enabled to be presented to the output of multiplexer 500. If all the timing signal lines in multiplexer 500 are loaded identically, the data output will transition in similar fashion to a full-rate clocked serializer output, but using less total power.

The quarter-rate serializer exemplified in FIGS. 4A-4D and 5 may operate at ¼ of the data-rate. In such an embodiment, the clock frequency is reduced by ¼, thereby reducing power consumption proportionately. Thus, in this fashion, the high-speed multiplexer 500 of FIG. 5 may operate at the ¼-rate frequency, while the rest of the serializing logic (e.g., m-bit to n-bit multiplexer 400 in FIG. 4A) operates at reduced frequency.

Figure 7:
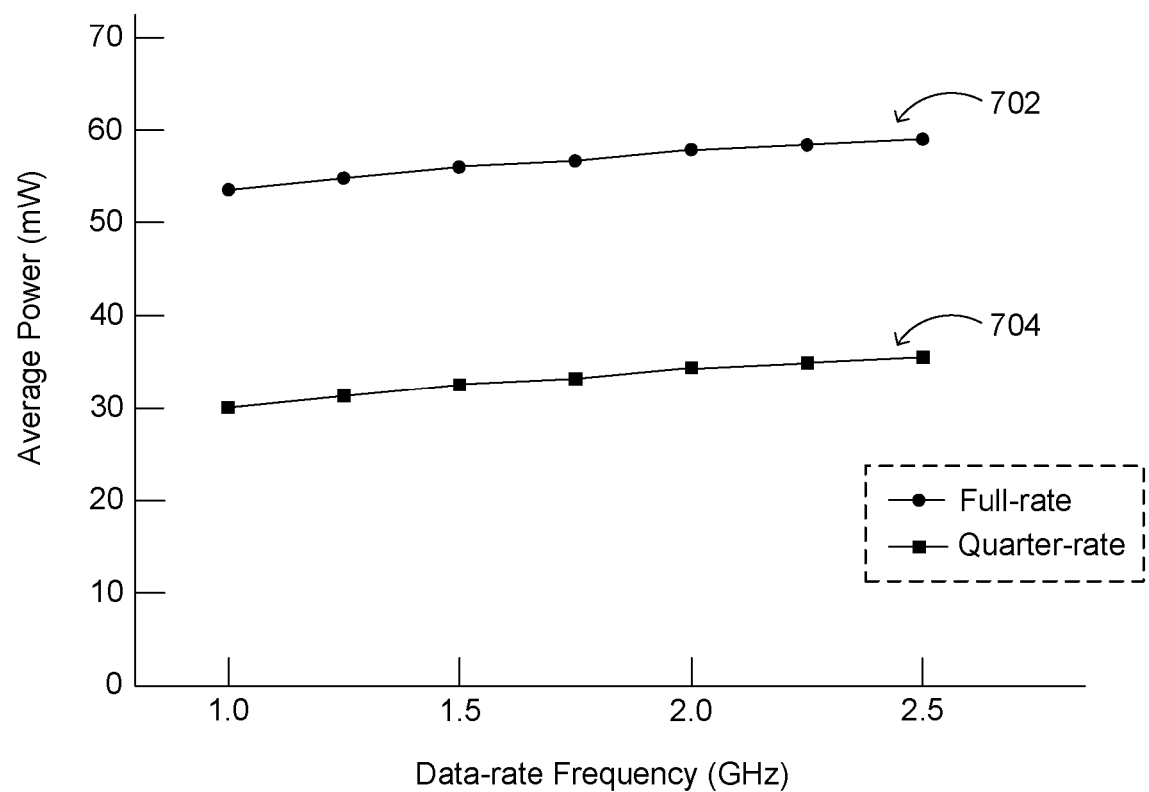
FIG. 7 is an exemplary power consumption graph for the serializer architecture of particular embodiments.

FIG. 7 shows an exemplary power consumption graph for the exemplary serializer architecture of FIGS. 4A-4D and 5. The plot shows a power reduction of about 40 to 45% (compare, e.g., quarter-rate data 704 versus full-rate data 702). Additional power reduction (e.g., greater than 50%) can be achieved (e.g., by reducing power consumption in the latches). As mentioned above, this architecture can be extended to other fractional-rate serializers (e.g., ½-rate, ⅕-rate, ⅛-rate, 1/16-rate, etc., serializers).

An Exemplary Method of Serializing Data

An exemplary method of serializing data includes the steps of: (i) storing an m-bit-wide parallel data word in a first data storage stage using a first timing signal; (ii) converting the m-bit-wide parallel data word into an n-bit-wide parallel data word; (iii) storing the n-bit-wide parallel data word in a second data storage stage using a second timing signal, the second timing signal having a frequency that is a (z*m)/n multiple of the first timing signal frequency, z being an integer of at least 1; and (iv) serializing the n-bit-wide parallel data word in response to successive (or sequential) phase-shifted derivatives of the second timing signal.

Figure 8:
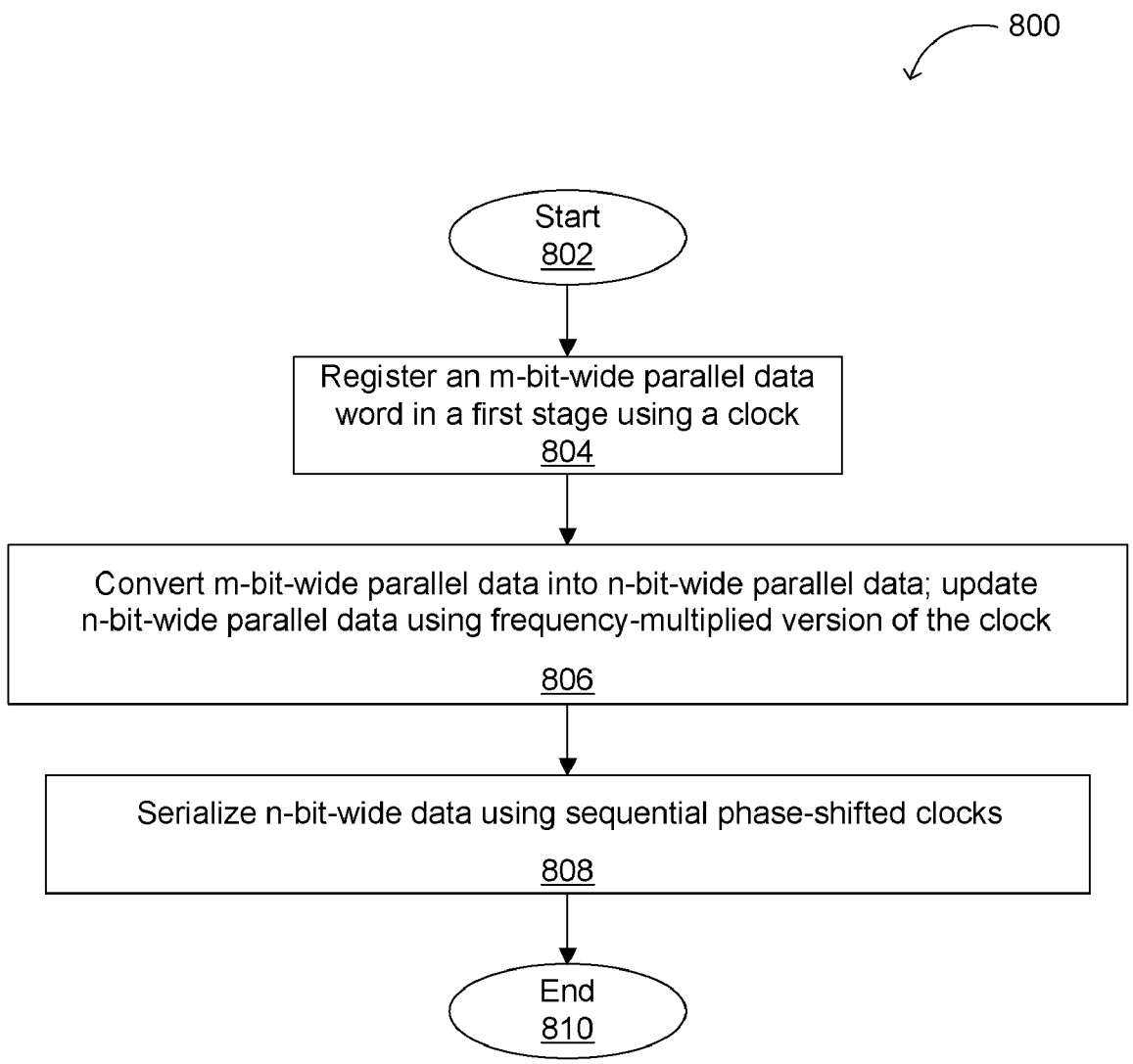
FIG. 8 is a flow diagram showing an exemplary method of serializing data in accordance with embodiments of the present invention.

FIG. 8 shows a flow diagram of an exemplary method 800 of serializing data in accordance with embodiments of the present invention. The flow can begin (802), and an m-bit-wide parallel data word can be stored in a first data storage stage using a clock or other timing signal (804). For example, the m bits of data can be stored in one or more registers, using a frequency-divided derivative of a full-rate clock signal. The register may comprise parallel flip-flops or latches (e.g., circuits 402 and 404, as shown in FIG. 4A). Next, the m-bit-wide parallel data word can be converted into an n-bit-wide parallel data word, for example using the 2m-to-n multiplexer 406 of FIG. 4A. The n-bit-wide parallel data word (e.g., transferred to or stored in second data storage stage 408 in FIG. 4A) can be updated on a frequency-multiplied derivative of the clock Cdiv20 in step 806 of FIG. 8. Alternatively, the timing signal that stores and/or updates n-bit-wide data (e.g., D1[3:0] in FIG. 4A) can be a full-rate divided by n clock signal, such as clock C0. For example, the first stage as shown in FIG. 4A can be utilized for such conversion, where m is an integer>n, and n is an integer of ≧2.

Serialization of the n-bit-wide parallel data word is performed in step 808 of FIG. 8. The n-bit-wide parallel data is output on a serial data node in response to sequential phase-shifted derivatives of the full-rate divided by n clock signal, such as clock C0. Serializing the data may comprise enabling a discharge path (e.g., in 4-to-1 multiplexer 482) from the serial data node (e.g., OUT or XOUT, as shown in FIG. 5) during overlapping phase-shifted derivatives (e.g., C90 and XC180) of the clock (e.g., C0). Adjacent bits of data are generally output in response to a successive (or the next sequential) phase of the timing signal (e.g., if D0 is output in response to a predetermined transition or logic level of C90 and XC180, then D1 may be is output in response to the same predetermined transition or logic level of C 180 and XC270).

A quarter-rate serializer as described herein is particularly well suited for high-speed applications. At very high speeds (e.g., greater than about 3 GHz), the full-rate serializer architecture of conventional approaches can be difficult to implement without sacrificing power and/or performance. Accordingly, the serializer of particular embodiments disclosed herein provides an architecture well suited for high-speed applications with reduced or minimal power consumption and reduced or minimal design complexity.

While the above examples include primarily standard logic and CML circuitry, one skilled in the art will recognize that other implementations and/or technologies may also be used in accordance with various embodiments. Further, one skilled in the art will recognize that current-based differential signaling and/or control may also be used in accordance with embodiments.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the claims appended hereto and their equivalents.

What is claimed is:

1. A current mode logic (CML) multiplexer configured to serialize n-bit-wide parallel data, comprising:
   a) a load circuit coupled between a first supply node and a serial data node;
   b) n selectors, wherein each of said selectors comprises: (i) a first transistor controllable by a bit of said n-bit-wide parallel data word, and coupled between a bias node and said serial data node; and (ii) a discharge path controllable by timing signals overlapping by a phase angle of about 360°/n; and
   c) a bias circuit coupled to said load circuit, said discharge path, and said bias node, said bias circuit being configured to sink or source a predetermined current through said n selectors.

2. The CML multiplexer of claim 1, wherein said load circuit comprises current source and diode loads.

3. The CML multiplexer of claim 1, wherein said bias circuit is configured to receive a control voltage, and to provide a fixed current therefrom, the magnitude of said fixed current being a fixed multiple of the magnitude of said predetermined current.

4. The CML multiplexer of claim 1, wherein n is an integer greater than or equal to four.

5. The CML multiplexer of claim 1, wherein said discharge path comprises second and third transistors in series.

6. The CML multiplexer of claim 1, wherein the first transistor is an NMOS transistor, the second transistor is an NMOS, and the third transistor is an NMOS transistor.

7. The CML multiplexer of claim 1, wherein said timing signals comprise n phases of a clock signal.

8. The CML multiplexer of claim 1, configured to receive differential parallel data and output differential serial data.

* * * * *